(12) United States Patent
Harder

(10) Patent No.: US 11,444,214 B2
(45) Date of Patent: Sep. 13, 2022

(54) CONDUCTIVE STRIP BASED MASK FOR METALLIZATION OF SEMICONDUCTOR DEVICES

(71) Applicant: Total Marketing Services, Puteaux (FR)

(72) Inventor: Nils-Peter Harder, San Jose, CA (US)

(73) Assignee: Total Marketing Services, Puteaux (FR)

( * ) Notice: Subject to any disclaimer, the term of this patent is extended or adjusted under 35 U.S.C. 154(b) by 114 days.

(21) Appl. No.: 17/099,536

(22) Filed: Nov. 16, 2020

(65) Prior Publication Data

US 2021/0074868 A1 Mar. 11, 2021

Related U.S. Application Data

(63) Continuation of application No. 14/866,843, filed on Sep. 25, 2015, now Pat. No. 10,840,394.

(51) Int. Cl.
*H01L 31/0224* (2006.01)
*H01L 31/18* (2006.01)

(52) U.S. Cl.
CPC ........... *H01L 31/022441* (2013.01); *H01L 31/022425* (2013.01); *H01L 31/18* (2013.01); *Y02E 10/50* (2013.01)

(58) Field of Classification Search
None
See application file for complete search history.

(56) References Cited

U.S. PATENT DOCUMENTS

| | | |
|---|---|---|
| 4,380,112 A | 4/1983 | Little |
| 6,191,353 B1 | 2/2001 | Shiotsuka et al. |
| 6,638,833 B1 | 10/2003 | Vassali et al. |
| 6,828,187 B1 | 12/2004 | Liu et al. |
| 7,339,110 B1 | 3/2008 | Mulligan et al. |

(Continued)

FOREIGN PATENT DOCUMENTS

| | | |
|---|---|---|
| CN | 1147157 | 4/1997 |
| CN | 1168541 | 12/1997 |

(Continued)

OTHER PUBLICATIONS

First Office Action from Chinese Patent Application No. 2016800432159 dated Feb. 2, 2021, 16 pgs.

(Continued)

*Primary Examiner* — Shannon M Gardner
(74) *Attorney, Agent, or Firm* — Schwabe, Williamson & Wyatt, P.C.

(57) ABSTRACT

Methods of manufacturing a semiconductor device, and resulting semiconductor device are described. In an example, the method for manufacturing a semiconductor device include forming a semiconductor region and forming a metal seed region over the semiconductor region. The method can include placing a conductive strip over a first portion of the metal region, where the conductive strip is formed over the semiconductor region. The method can include bonding a contacting portion of the conductive strip to the first portion the metal region. The method can include etching a second portion of the metal region and where the conductive strip inhibits etching of the first portion of the metal region. In an example, the conductive strip can have a coating. In one example, the semiconductor device can be a solar cell.

20 Claims, 6 Drawing Sheets

(56) References Cited

U.S. PATENT DOCUMENTS

| | | |
|---|---|---|
| 8,766,090 B2 | 7/2014 | Sewell et al. |
| 9,640,710 B2 | 5/2017 | Pearce et al. |
| 2005/0241692 A1 | 11/2005 | Rubin et al. |
| 2008/0299297 A1 | 12/2008 | Cousins et al. |
| 2009/0056801 A1 | 3/2009 | Chun-Hsiung et al. |
| 2010/0051085 A1 | 3/2010 | Weidman et al. |
| 2010/0200058 A1 | 8/2010 | Funakoshi |
| 2013/0160825 A1 | 6/2013 | Lantzer et al. |
| 2013/0183796 A1 | 7/2013 | Stewart et al. |
| 2015/0318420 A1 | 11/2015 | Sewell et al. |
| 2017/0222082 A1 | 8/2017 | Lin et al. |

FOREIGN PATENT DOCUMENTS

| | | |
|---|---|---|
| CN | 1016-81902 | 3/2010 |
| CN | 103022166 | 3/2013 |
| CN | 105742403 | 7/2016 |
| TW | 318286 | 10/1997 |
| TW | 578279 | 3/2004 |
| WO | WO 2015/048197 | 4/2015 |
| WO | WO 2015/076465 | 5/2015 |
| WO | WO 2016/109909 | 7/2016 |

OTHER PUBLICATIONS

Office Action from German Patent Application No. 11 2016 004 360.0 dated Apr. 19, 2021, 13 pgs.

Second Office Action from Chinese Patent Application No. 201680043215.9 dated Nov. 2, 2021, 17 pgs.

Gress, et al., "Wire bonding as a cell interconnection technique for polycrystalline silicon thin-film solar cells on glass," Progress in Photovoltaics; Research and Applications, Mar. 11, 2010, pp. 221-228, vol. 18.

Meyer Burger Smartwire Connection Technology, Meyer Burger Technology AG, www.meyerburger.com, 2013, 2 pgs.

Meyer Burger Smartwire Connection Technology, www.meyerburger.com, 2014, 4 pgs.

International Search Report and Written Opinion for PCT Patent Application No. PCT/US16/51788 dated Dec. 15, 2016, 13 pgs.

Non-Final Office Action from U.S. Appl. No. 14/866,843 dated May 24, 2017, 12 pgs.

Final Office Action from U.S. Appl. No. 14/866,843 dated Nov. 30, 2017, 7 pgs.

International Preliminary Report on Patentability from PCT/US2016/051788 dated Apr. 5, 2018, 9 pgs.

Non-Final Office Action from U.S. Appl. No. 14/866,843 dated Jun. 15, 2018, 22 pgs.

Final Office Action from U.S. Appl. No. 14/866,843 dated Feb. 8, 2019, 9 pgs.

Non-Final Office Action from U.S. Appl. No. 14/866,843 dated Jun. 25, 2019, 13 pgs.

Final Office Action from U.S. Appl. No. 14/866,843 dated Dec. 31, 2019, 13 pgs.

Office Action from Taiwanese Patent Application No. 105130377 dated Mar. 20, 2020, 7 pgs.

CONDUCTIVE STRIP BASED MASK FOR METALLIZATION OF SEMICONDUCTOR DEVICES

CROSS-REFERENCE TO RELATED APPLICATIONS

This application is a Continuation of U.S. patent application Ser. No. 14/866,843, filed on Sep. 25, 2015, the entire contents of which are hereby incorporated by reference herein.

STATEMENT REGARDING FEDERALLY SPONSORED RESEARCH OR DEVELOPMENT

This invention was made with government support under DE-EE0008175 awarded by The U.S. Department of Energy. The government has certain rights in the invention.

BACKGROUND

Semiconductor devices, for example photovoltaic (PV) cells among others, are well known electronic devices. In one example, photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Efficiency in producing semiconductor devices is directly related to the cost effectiveness of such semiconductor devices. Accordingly, techniques for increasing the efficiency of semiconductor devices, or techniques for increasing the efficiency in the manufacture of semiconductor devices, are generally desirable. Some embodiments of the present disclosure allow for increased semiconductor devices manufacture efficiency by providing novel processes for fabricating semiconductor devices structures.

DETAILED DESCRIPTION

Figure 1:
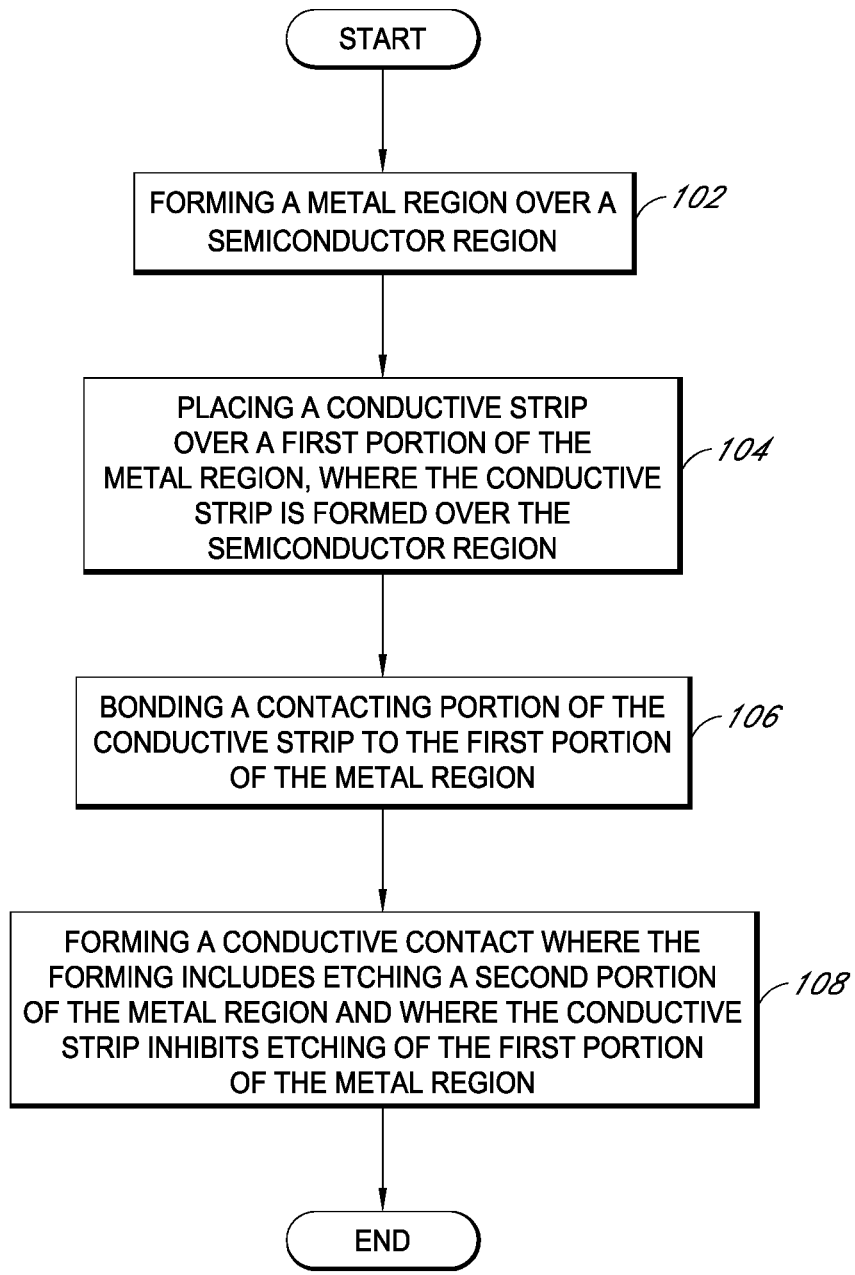
FIG. 1 illustrates a flow chart representation of an example method for manufacturing a semiconductor device, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive strip does not necessarily imply that this conductive strip is the first conductive strip in a sequence; instead the term "first" is used to differentiate this conductive strip from another conductive strip (e.g., a "second" conductive strip).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification includes a description of an example method for manufacturing a semiconductor device, followed by example semiconductor devices formed from the described methods. In an example, the semiconductor devices can be, but are not limited to, solar cells as described in FIGS. 2-10 below. Various examples are provided throughout. Although many of the examples are drawn and described in the context of back-contact solar cells, the structures and techniques described herein can apply equally to front-contact solar cells.

Turning now to FIG. 1, a method for manufacturing a semiconductor device is shown, according to some embodiments. In various embodiments, the method of FIG. 1 can include additional (or fewer) blocks than illustrated. For example, in some embodiments prior to forming a metal seed region, a semiconductor region can be formed in or on a front or back side of the semiconductor device.

Figure 2:
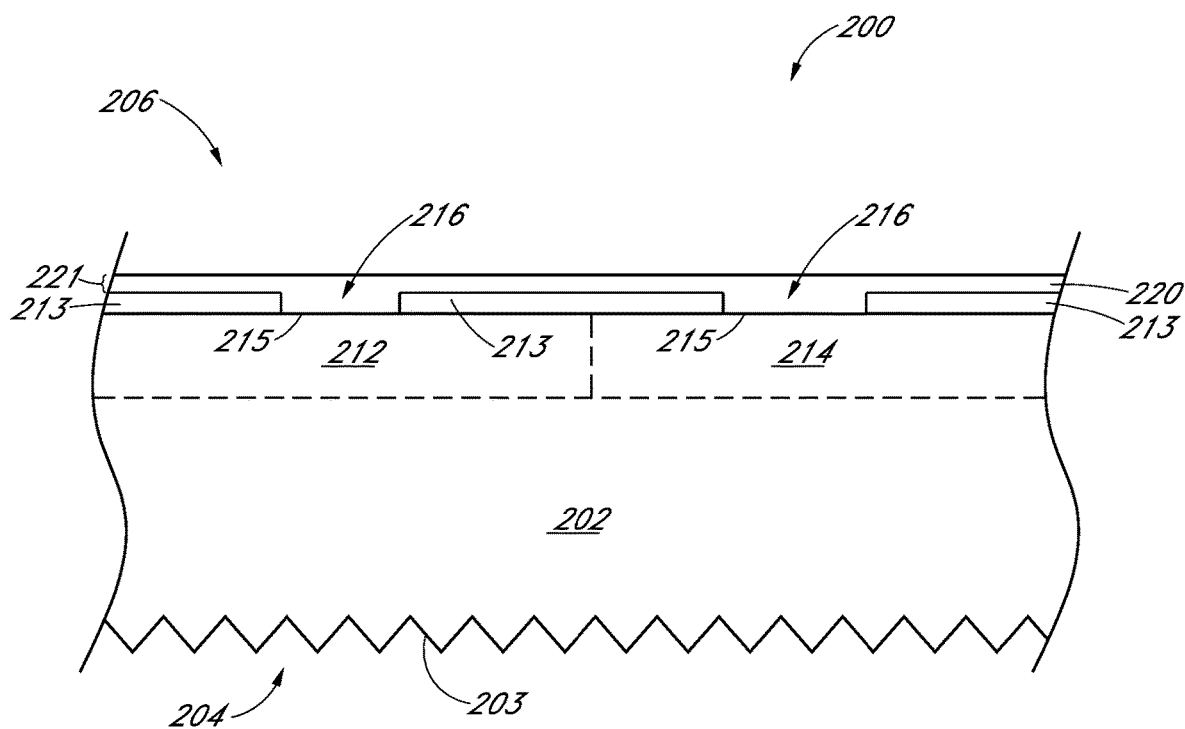
FIGS. 2-5 illustrate cross-sectional views of an example semiconductor device during the method of FIG. 1, according to some embodiments.

Referring to FIG. 2, and corresponding operation 102 of the flowchart of FIG. 1, a metal region 220 can be formed over a surface 215 of the semiconductor device 200, according to some embodiments. In an embodiment, the semiconductor device 200 can include a substrate 202. In an embodiment, the semiconductor device 200 can have a front side 204 which faces the sun during normal operation and a back side 206 opposite the front side 204. In one example, the semiconductor device 200 is a solar cell.

In an embodiment, a dielectric region 213 can be formed over the surface 215 of the substrate 202, as shown. In an embodiment, the dielectric region 213 can include silicon oxide and/or other oxides. In an embodiment, a contact opening 216 can be formed in the dielectric region 213 as shown and, as a result, the metal region 220 can be formed on the surface 215 of the substrate 202 within the contact opening 216. In an example, the contact opening 216 can be formed by laser ablation and/or by a mask and etch process, among others.

In an embodiment, the substrate 202 can be a silicon substrate. In some embodiments, the silicon substrate can be cleaned, polished, planarized and/or thinned or otherwise processed prior to the formation of the metal region 220. In an embodiment, the silicon substrate can be single-crystalline or a multi-crystalline silicon substrate. In an embodiment, the silicon substrate can be an N-type or a P-type silicon substrate.

In an embodiment, prior to the formation of the metal region 220, a semiconductor region can be formed in or above the substrate 202. In an example, a first semiconductor region 212 can include an N-type doped region. In one example, a second semiconductor region 214 can include a P-type doped region. In an embodiment, the first and second semiconductor regions 212, 214 can be in the substrate 202. In an embodiment, the first and second semiconductor regions 212, 214 can be formed over the substrate 202. In an example, the first and second semiconductor regions 212, 214 can be doped polysilicon regions. In an embodiment, the doped polysilicon regions can be formed over the substrate. In one embodiment, a dielectric region (e.g., a tunnel oxide) can be formed between the doped polysilicon regions and the substrate. In an embodiment, the semiconductor regions 212, 214 can be formed at the back side 206 of the semiconductor device 200, as shown in FIG. 2. In some embodiments, one or more semiconductor regions can be formed, instead, on the front side 204 of the semiconductor device 200. In one example, a first semiconductor region can be formed on the back side of the semiconductor device 200 and/or a second semiconductor region can be formed on the front side of the semiconductor device 200. In some embodiments, a metal region can be formed over a semiconductor region on the front side of the semiconductor device. In an example, a first metal region can be formed over a first semiconductor region on the back side and/or a second metal region can be formed over a second semiconductor region on the front side of the solar cell. Thus, in some examples, a plurality of semiconductor and/or metal regions (e.g., 2 or more) can be used.

In an embodiment, the metal region 220 can include aluminum (e.g., an aluminum region), aluminum/Si, nickel, copper, titanium, tungsten, and/or alloys thereof, among other examples. In an embodiment, the metal region 220 can be formed by blanket deposition, sputtering, by printing techniques (e.g., screen printing, ink-jet printing and/or spin coating), among other examples. In an embodiment, the metal region 220 can have a thickness 221 in a range of 50-1000 nanometers. In one embodiment, the metal region 220 can have a thickness 221 greater than 1000 nanometers (e.g., 2000 nanometers).

In an embodiment, the front side 204 of the semiconductor device 200 can be a textured surface 203 as shown in FIG. 2. In an embodiment, a hydroxide-based wet etchant can be used to form at least a portion of the textured surface 203 and/or to texturize exposed portions of the substrate 202. A textured surface may be one which has a regular or an irregular shaped surface. In an example, a regular shaped surface can be a smooth and/or planarized surface. In one example, an irregular shaped surface can be a rough, uneven, and/or a non-planar surface. In an embodiment, the textured surface 203 at the front side 204 of the solar cell 200 can be configured to scatter incoming light, where the light scattered from the front side 204 of the solar cell 200 can decrease the amount of light reflected off of the front side 204 and, thus, increase the light collected at the front side 204 of the solar cell 200.

Figure 3:
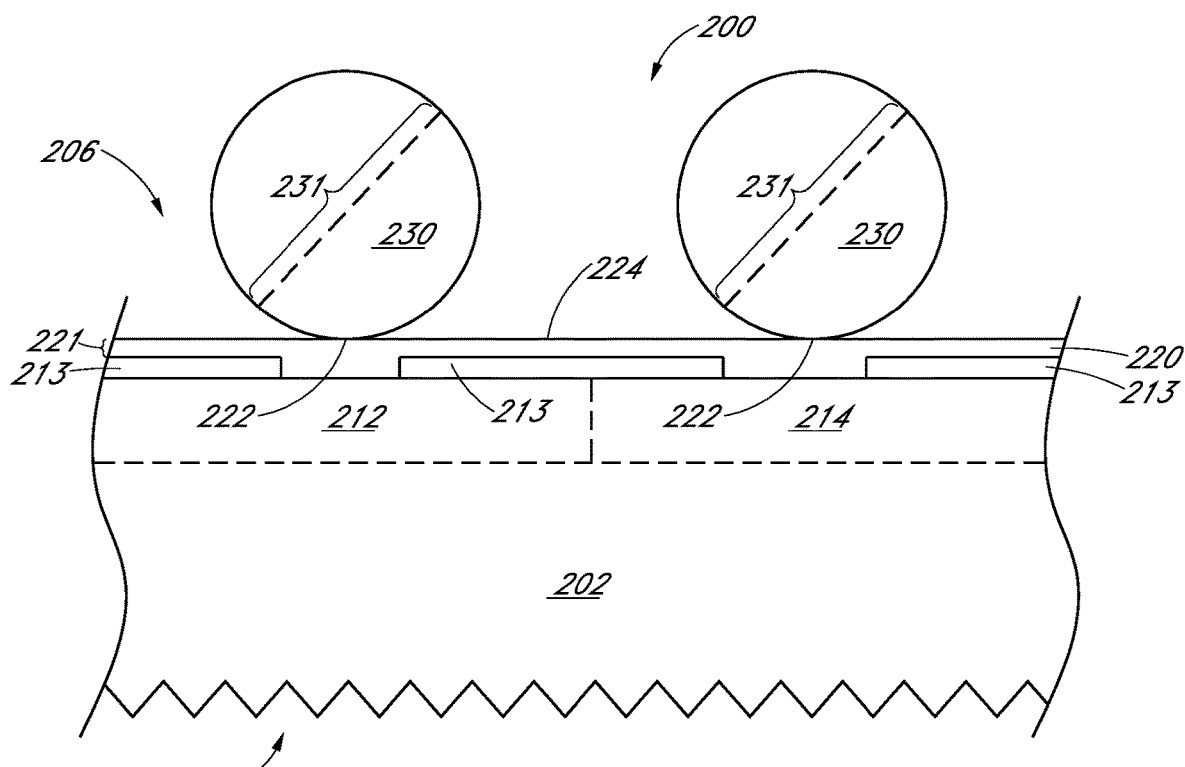

Referring to FIG. 3, and corresponding operation 104 of the flowchart of FIG. 1, a conductive strip 230 can be placed over a first portion 222 of the metal region 220, according to some embodiments. In an embodiment, the conductive strip 230 can be placed over the first portion 222 of the metal region 220, where the conductive strip 230 can be located substantially parallel with the semiconductor regions 212, 214 as shown. In an example, a machine vision system can be used to align the conductive strip 230 over the first portion 222 of the metal region 220, where the placement is substantially parallel with one of the semiconductor regions 212, 214. In an embodiment, the conductive strip 230 can be a conductive wire, ribbon, pre-cut foil or a strip of foil. In an example, the conductive strip 230 can include copper, nickel, aluminum, and/or alloys thereof, among other examples. In one example, the conductive strip 230 can be a copper wire or an aluminum foil. In an embodiment, the conductive strip 230 can have a thickness 231 in a range of 50-1200 nanometers. In one embodiment, the conductive strip 230 can have a thickness 231 greater than 1200 nanometers (e.g., 2000 nanometers). In an embodiment, the ratio of the thickness 231 can be twice, ten times or 100 times, or more, to the thickness 221. In an embodiment, a second portion 224 of the metal region 220 can be exposed, e.g., not have any conductive strip over that portion. As shown in FIG. 3, a respective conductive strip 230 is aligned over each of semiconductor regions 212 and 214. In an embodiment, a plurality of conductive strips can be placed over the metal region. In an example, a first and a second conductive strip can be placed over the metal region. In one example, the first and second conductive strips can be placed over substantially the same semiconductor region (e.g., placed over semiconductor regions of the same polarity). In some examples, the second conductive strip can be placed over a second, different, semiconductor region than the first conductive strip (e.g., placed over semiconductor regions of different polarities).

In some embodiments, a first conductive strip can be placed on the front side 204 and/or back side 206 of the semiconductor device 200. In an example, a first conductive strip can be placed over a first semiconductor region located on the back side of the semiconductor device 200 and/or a second conductive strip can be placed over a second semiconductor region located on the front side 204 of the semiconductor device 200. In some embodiments, a first and second metal region can be formed between the first and second conductive strips and the first and second semiconductor regions, respectively.

Figure 4:
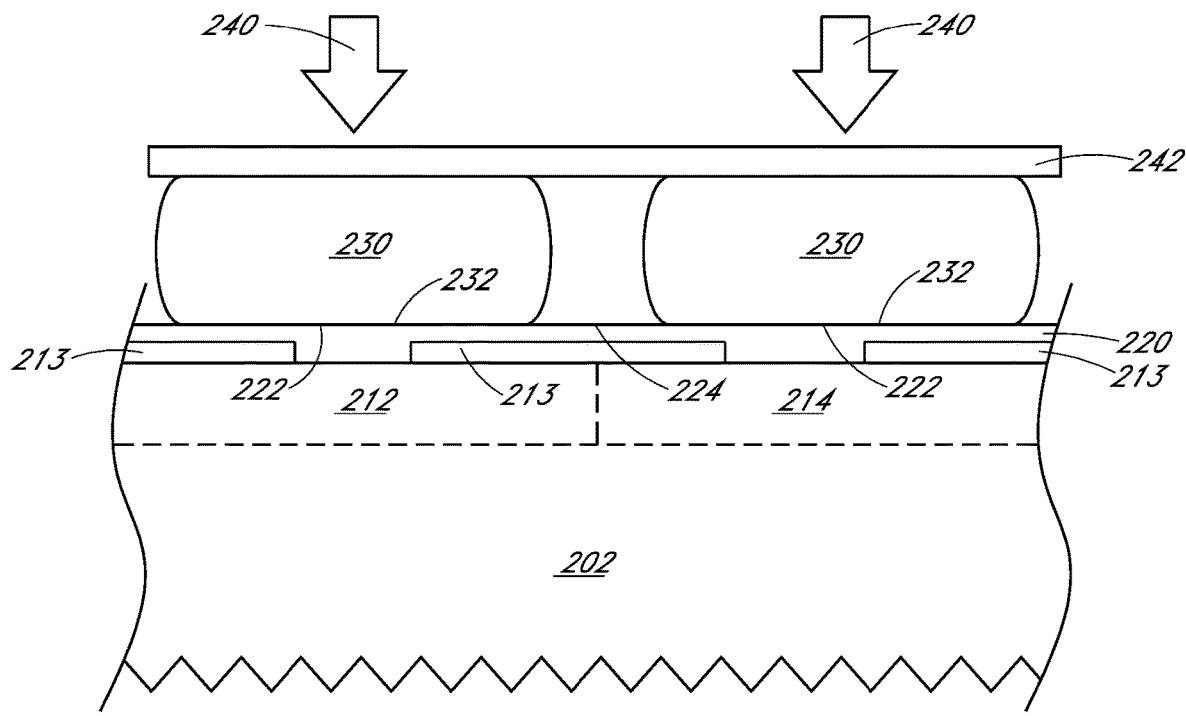

Referring to FIG. 4, and corresponding operation 106 of the flowchart of FIG. 1, a bonding process can be performed to bond a contacting portion 232 of the conductive strip 230 to the first portion 222 of the metal region 220. In an embodiment, the bonding process includes electrically connecting the conductive strip 230 to the metal region 220. As shown, the contacting portion 232 can be a portion of the conductive strip 230 in contact, e.g., flatly contacting, the first portion 222 of the metal region 220. In an embodiment, by flatly contacting the first portion 222 of the metal region 220, the contacting portion 232 can inhibit etching at the first portion 222 of the metal region 220 (e.g., during a subsequent etching process), whereas any air pockets or gaps between the conductive strip 230 and the metal region 220 can allow for etching at those regions.

In an embodiment, the bonding process of operation 106 can include applying a force 240 to the contacting portion of the conductive strip 230 to electrically connect the conductive strip 230 to the metal region 220. In an example, as shown in FIG. 4, an applicator 242 can be used to apply the force 240 to the contacting portion of the conductive strip 230. In an example, the applicator 242 can be roller or a squeegee. In one such example, using the applicator 242 allows for applying the force uniformly to the contacting portion 232 of the conductive strip 230 and the first portion 222 of the metal region 220. In an example, a thermocompression process can be performed to electrically connect the contacting portion conductive strip 230 to the metal region 220.

In an embodiment, the bonding can include heating the contacting portion 232 of the conductive strip 230 to electrically connect the conductive strip 230 to the metal region 220. In one example, heat can be applied after, during, or before applying a force 240 to the contacting portion of the conductive strip 230. In an example, a laser can be used to heat the contacting portion of the conductive strip. In one example, a laser can be used to electrically connect the conductive strip 230 to the metal region 220. In some examples, a welding process (e.g., a laser weld process) can be used to bond the contacting portion 232 of the conductive strip 230 to the first portion 222 of the metal region 220. In one embodiment, the heating can include inductive heating and/or contacting heating.

In an embodiment, the conductive strip 230 can include a conductive adhesive disposed between the contacting portion 232 of the conductive strip and the first portion 222 of the metal region 230. In an example, the conductive adhesive can be a solder paste. In an embodiment, the bonding can include heating the conductive adhesive (e.g., solder paste) to electrically connect the conductive strip 230 to the metal region 220. In one embodiment, heating the conductive adhesive can include inductive heating and/or contacting heating.

Figure 5:
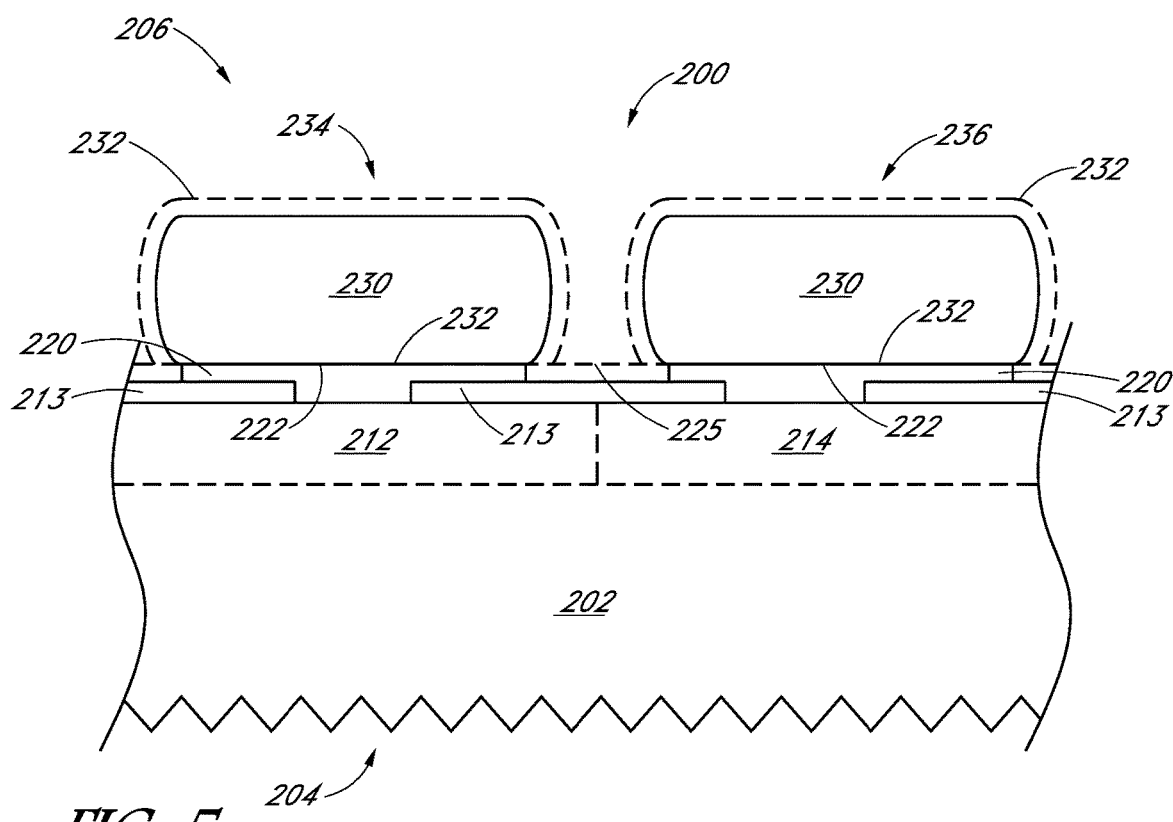

Referring to FIG. 5, and corresponding operation 108 of the flowchart of FIG. 1, an etching process can be performed to form conductive contacts 234, 236, according to some embodiments. In one example, the second portion 224 the metal region 220 of FIG. 4 can be etched 225 to form the conductive contacts 234, 236. In an example, the etching 225 can form a first conductive contact 234 over the first semiconductor region 212 and a second conductive contact 236 over the second semiconductor region 214. In one example, the etching 225 can electrically separate the first conductive contact 234 from the second conductive contact 236. In an example, the etching 225 can include at least partially etching the conductive strip 230, as shown in FIG. 5, where the conductive strip 230 can inhibit etching, at block 108, of the first portion 222 of the metal seed region 220. In one example, as shown, the first and second conductive contacts 234, 236 can be formed on the back side 206 of the semiconductor device 200. In some embodiments, the conductive strip 230 may not be etched (e.g., the coating 335 is not etched at all).

In some embodiments, one or more conductive contacts can instead be formed at the front side of the semiconductor device. In an example, a first conductive contact can be formed over a first semiconductor region located on the back side of the semiconductor device 200 and/or a second conductive contact can be formed over a second semiconductor region located on the front side of the semiconductor device 200.

In an example, the conductive strip 230 of FIG. 4 can have a thickness 331 greater than a thickness 321 of the metal region 220. In the same example, the etching 225 can include etching through the metal region 220 having the thickness 331 to electrically separate the first conductive contact 236 from second conductive contact 236. In the same example, the etching 225 can include partially etching the conductive strip 230 having the thickness 331, where the conductive strip 230 inhibits etching of the first portion 222 of the metal seed region 220.

In an embodiment, a first etchant can be used to etch through the second portion 224 of the metal region 220 of FIG. 4. In an example, the first etchant can include an acid having oxidizing agents (e.g., hydrogen peroxide). In some examples, the first etchant can include a base (e.g., potassium hydroxide, sodium hydroxide). In one example, the conductive strip 230 of FIG. 4 can have a first thickness greater than a second thickness of the metal seed region 220 and the conductive strip 230 can include substantially the same metal as the metal region 220. In the same embodiment, the first etchant can be configured to etch through the second thickness of the metal region 220 and partially etch the first thickness of conductive strip 230. In one embodiment, etch duration can be configured to allow etching through the second portion 224 of the metal region 220 and partially etching the conductive strip 230. In an embodiment, an etch duration can be configured to allow etching through the second portion 224 of the metal region 220 and to only partially etch the conductive strip 230. In some embodiments, multiple etchants (e.g., a first, second, etc.) can be used. In an example, the first etchant can be used to etch the metal region 220 including a first metal and a second etchant can be used to etch the conductive strip 230 including a second, different, metal. In one embodiment, the conductive strip 230 can be referred to as a partial sacrificial etching barrier. In an embodiment, the first and second etchants can be substantially the same and/or different etchant altogether (e.g., acid having oxidizing agents, etc.).

In an embodiment, the conductive contacts 234, 236 can include the conductive strip 230 and the metal region 220. In one embodiment, the conductive contacts 234, 236 can form metal contact fingers. In an embodiment, the metal contact fingers can be interdigitated.

Figure 6:
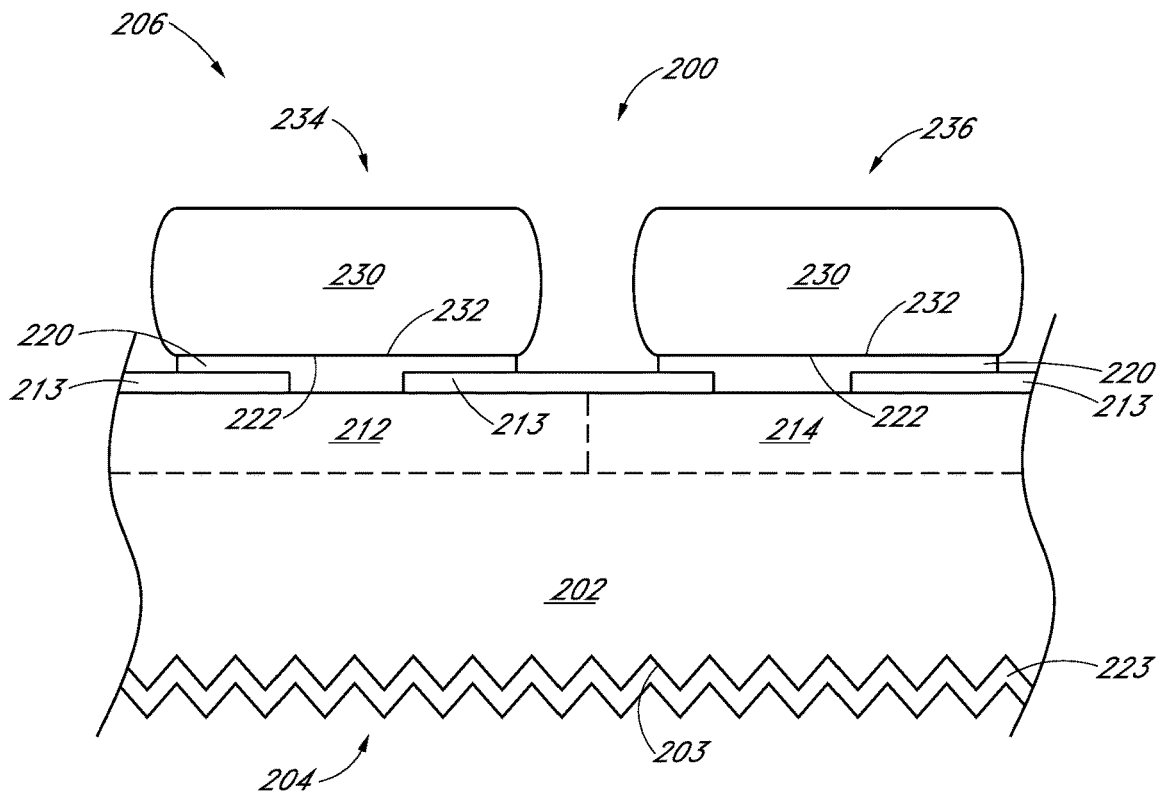
FIG. 6 illustrates an example semiconductor device, according to some embodiments.

FIG. 6 illustrates an example semiconductor device formed from the methods described in FIGS. 2-5, according to some embodiments. As shown, the semiconductor device can be a solar cell 200, which can have a front side 204 which faces the sun during normal operation and a back side 206 opposite the front side 204.

In an embodiment, the front side 204 of the solar cell 200 can have a textured surface 203 as shown in FIG. 6. A textured surface may be one which has a regular or an irregular shaped surface. In an example, a regular shaped surface can be a smooth and/or planarized surface. In one example, an irregular shaped surface can be a rough, uneven, and/or a non-planar surface. In an embodiment, the textured surface 203 at the front side 204 of the solar cell 200 can be configured to scatter incoming light, where the light scattered from the front side 204 of the solar cell 200 can decrease the amount of light reflected off of the front side 204 and, thus, increase the light collected at the front side 204 of the solar cell 200. In an embodiment, a front dielectric region 223 can be formed over the surface 203. In some embodiments, the front dielectric region 223 can include silicon oxide, among other oxides.

In an embodiment, the solar cell 200 can include a substrate 202. In an embodiment, the substrate 202 can be a silicon substrate. In some embodiments, the silicon substrate can be single-crystalline or a multi-crystalline silicon substrate. In one embodiment, the silicon substrate can be an N-type or a P-type silicon substrate.

In an embodiment, the substrate 202 can include a semiconductor region 212, 214 on the back side 206 of the solar cell 200. In an example, a first semiconductor region 212 can include an N-type doped region. In one example, a second semiconductor region 214 can include a P-type doped region. In an embodiment, the first and second semiconductor regions 212, 214 can be in the substrate 202. In an embodiment, the first and second semiconductor regions 212, 214 can be disposed over the substrate 202. In an example, the first and second semiconductor regions 212, 214 can be doped polysilicon regions. In an embodiment, the doped polysilicon regions can be disposed over the substrate 202 at the back side 206 of the solar cell 200. In one embodiment, a dielectric region (e.g., a tunnel oxide) can be disposed between the doped polysilicon regions and the substrate.

In an embodiment, conductive contacts 234, 236 can be disposed on the semiconductor regions 212, 214 at the back side 206 of the solar cell 200. In an example, a first conductive contact 234 can be disposed over the first semiconductor region 212. In one example, a second conductive contact 236 can be disposed over the second semiconductor region 214. In an example, the conductive contacts 234, 236 can be metal contact fingers. In some examples, the metal contact fingers can be interdigitated. In an embodiment, the conductive contacts 234, 236 allow for pathways for electrical current conduction from the first and second semiconductor regions 212, 214 to an external circuit. In some embodiments, the conductive contacts 220, 221 can include a metal region 220. In an embodiment, a dielectric region 213 can be disposed between the metal region 220 and the substrate 202, as shown. In one embodiment, the dielectric region 213 can include silicon oxide, among other oxides. In an embodiment, the metal region 220 can include aluminum (e.g., an aluminum region), aluminum/Si, nickel, copper, titanium, tungsten, and/or alloys thereof. In an embodiment, the metal region 220 can have a thickness approximately in the range of 50-1000 nanometers.

In an embodiment, the conductive contacts 234, 236 can include a conductive strip 230. In one embodiment, the conductive strip 230 can be disposed on the metal region 220, as shown. In an embodiment, the conductive strip 224 can include copper, nickel, aluminum, iron, and/or alloys thereof. In an embodiment, the conductive strip 230 can have a thickness approximately in the range of 60-1200 nanometers.

In some embodiments, the metal region 220 and the conductive strip 230 can include the same metal. In an example, the metal region 220 and the conductive strip 230 can both, respectively, include aluminum. In some examples, the metal at the first portion 222 of the metal seed region 220 and the metal of the contacting portion 232 can be substantially the same. For example, the first portion 222 of the metal region 220 and contacting portion 232 of the conductive strip 230 can be aluminum or an aluminum-containing alloy.

In one embodiment, the metal region 220 and the conductive strip 230 can be substantially different. In one example, the metal region 220 can include aluminum and the conductive strip 230 can include iron or steel. In the same example, a thermocompression process can be used to bond the conductive strip including iron or steel to the metal seed region including aluminum.

In an embodiment, another semiconductor region can be located on the front side 204 of a solar cell 200. In an example, the semiconductor region can include an N-type or P-type doped region. In an embodiment, another conductive contact can be disposed on the semiconductor region on the front side 204 of the solar cell 200. In an embodiment, the conductive contact can also include a conductive strip bonded to a metal region, where the conductive contact is located on the semiconductor region on the front side of the solar cell 200. In the same embodiment, the semiconductor device 200 can be a front contact solar cell.

Figure 7:
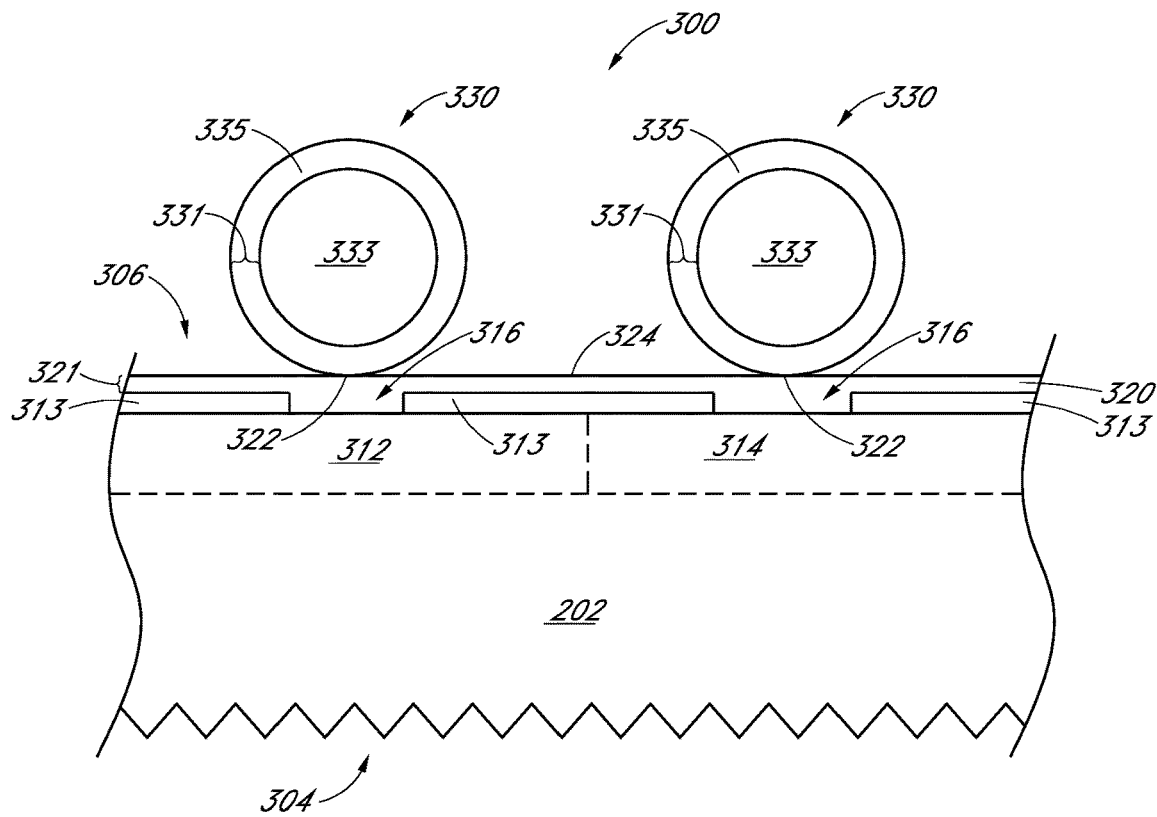
FIGS. 7-9 illustrate cross-sectional views of another example semiconductor device during the method of FIG. 1, according to some embodiments.
Figure 8:
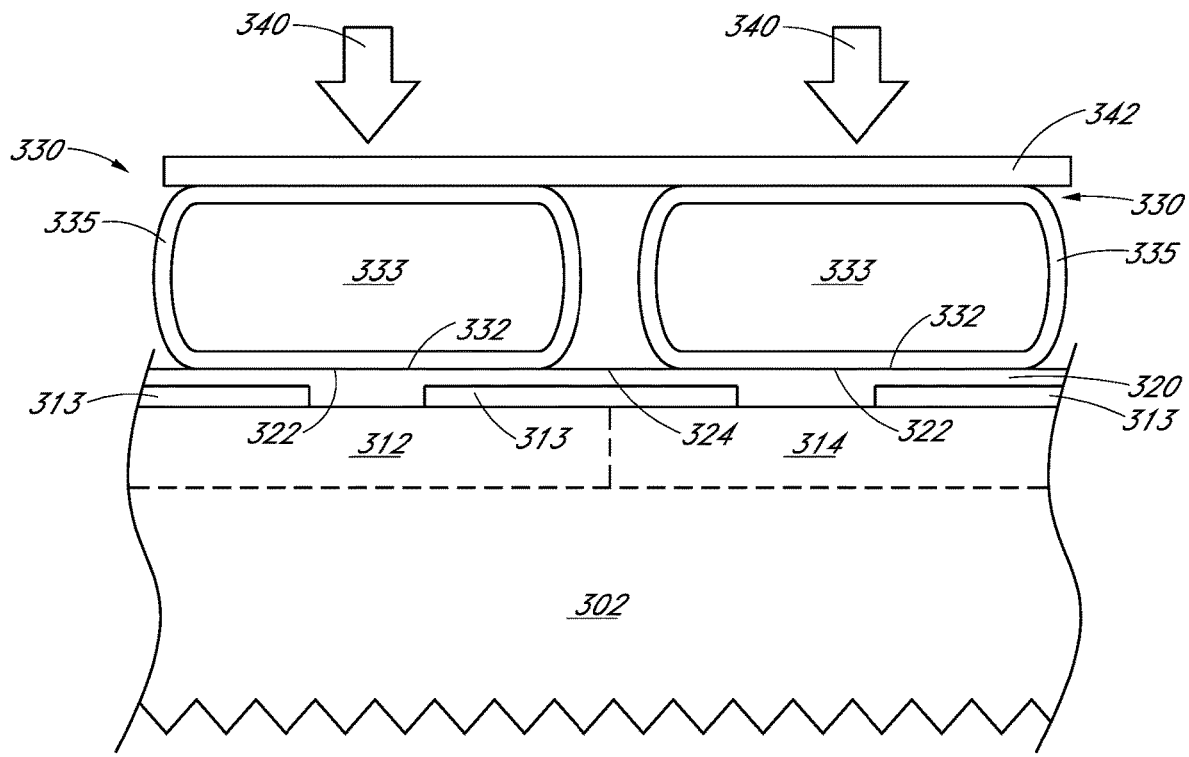
Figure 9:
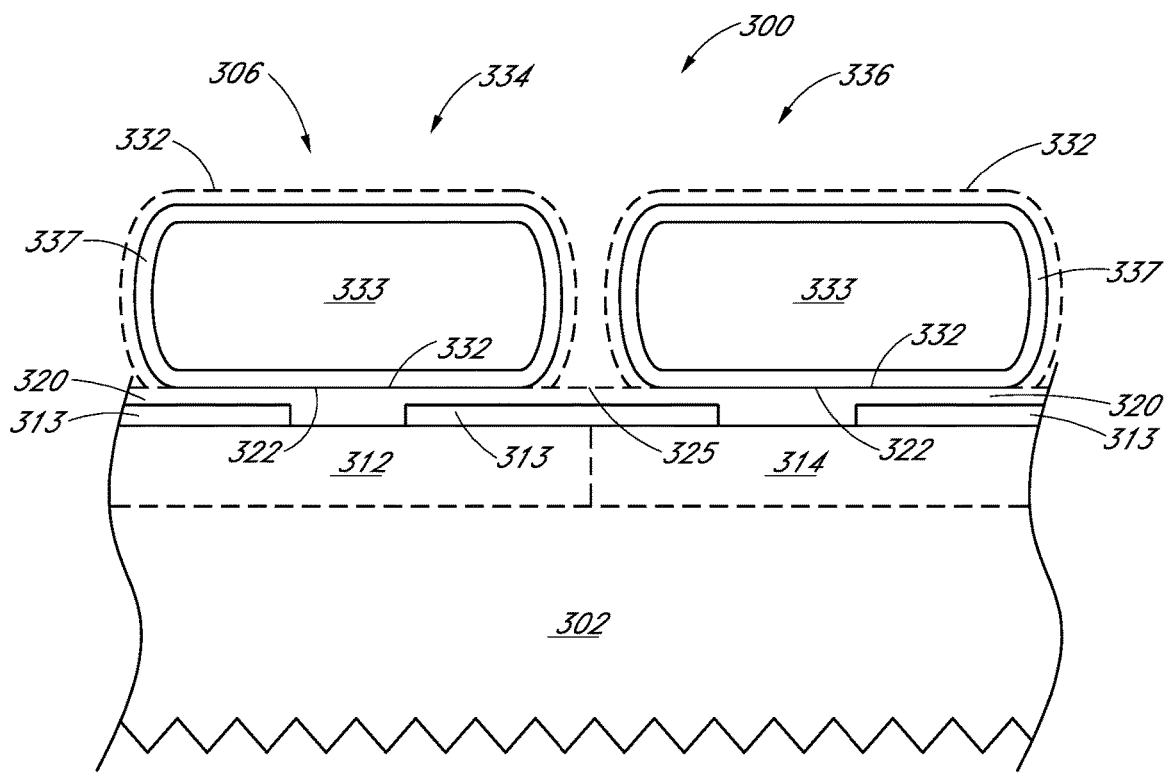

With reference to FIGS. 7-9, a method of manufacturing a semiconductor device is shown, according to some embodiments. As shown, the methods of FIGS. 7-9 are substantially similar to the methods of FIGS. 2-5. The method of FIGS. 7-9 have similar reference numbers to elements of FIG. 2-5, wherein like reference numbers refer to similar elements throughout the figures. In an embodiment, the structure of the semiconductor device 300 of FIGS. 7-9 are substantially similar to the structure of the semiconductor device 200 in FIGS. 2-5, respectively, except as described below. Thus, unless specifically pointed out in FIGS. 7-9, the description of similar structures in FIGS. 2-5 applies equally to the structures of FIGS. 7-9, respectively.

Referring to FIG. 7, and corresponding operation 104 of the flowchart of FIG. 1, a coated conductive strip 330 can be placed over a first portion 322 of a metal region 320, according to some embodiments. In an example, coated conductive strips 330 can be placed over a first and second semiconductor regions 312, 314. In one embodiment, the coated conductive strips 330 can be placed substantially parallel with the semiconductor regions 312, 314 as shown. In an embodiment, the coated conductive strip 330 can include a metal strip 333 having a coating 335 as shown. In one embodiment, the coating 335 can have a thickness 331 approximately in the range of 1-10 μm. In an embodiment, the thickness 331 of the coating 335 can be greater than or equal to a thickness 321 of the metal region 320. In an embodiment, the metal region 320 can have a thickness approximately in a range of 50-1000 nanometers. In an embodiment, the coating 335 can include aluminum (e.g., an aluminum region), aluminum/Si, nickel, copper, titanium, tungsten, and/or alloys thereof, among other examples. In an embodiment, the coating can include a solder paste. In an embodiment, the metal strip can include nickel, copper, iron and steel, among other examples. In an embodiment, the ratio of the thickness 331 can be twice, ten times or 100 times, or more, to the thickness 321. In an embodiment, the coated conductive strip 330 can be a coated conductive wire, coated ribbon, coated pre-cut foil or a coated strip of foil. In one example, the coated conductive strip 330 can be a coated copper wire or a coated aluminum foil.

In some embodiments, a first coated conductive strip can be placed on the front side 304 and/or back side 306 of the semiconductor device 300. In an example, a first conductive strip can be placed over a first semiconductor region located on the back side of the semiconductor device 300 and/or a second conductive strip can be placed over a second semiconductor region located on the front side 304 of the semiconductor device 300. In some embodiments, a first and second metal region can be formed between the first and second conductive strips and the first and second semiconductor regions, respectively. As discussed above, a plurality of conductive strips (e.g., first, second conductive strips) ca be used.

Referring to FIG. 8, and corresponding operation 106 of the flowchart of FIG. 1, a bonding process can be performed to bond a contacting portion 332 of the coated conductive strip 330 to the first portion 322 of the metal region 320. In an embodiment, the bonding process of FIG. 8 is substantially similar to the bonding process described in FIG. 4. Therefore the description of corresponding portions of FIG. 4 applies equally to the description of FIG. 8.

Referring to FIG. 9, and corresponding operation 108 of the flowchart of FIG. 1, an etching process can be performed to form conductive contacts 334, 336, according to some embodiments. In an embodiment, the etching process of FIG. 9 is substantially similar to the etching process described in FIG. 5, except as described below. Therefore the description of corresponding portions of FIG. 5 applies equally to the description of FIG. 9.

In one example, as shown, the first and second conductive contacts 334, 336 can be formed on the back side 306 of the semiconductor device 300. In some embodiments, one or more conductive contacts including a coated conductive strips can instead be formed at the front side of the semiconductor device. In an example, a first conductive contact can be formed over a first semiconductor region located on the back side of the semiconductor device 300 and/or a second conductive contact can be formed over a second semiconductor region located on the front side of the semiconductor device 300.

In an embodiment, the coated conductive strip 330 can inhibit etching of the first portion 322 of the metal region 320. In an example, the etching 325 can include etching the coating 335 of the coated conductive strip 330, where the coating 335 can inhibit etching, at block 108, of the first portion 322 of the metal region 320. In one example, the coating 335 of coated conductive strip 330 of FIG. 8 can have a first thickness 331 equal to a second thickness 321 of the metal seed region 220. In the same example, the etching 325 can include etching through the metal region 320 having the second thickness 321. In the same example, the etching 325 can include etching the coating 335 of the coated conductive strip 330 having the first thickness 331, where the etching 335 at least partially exposes the metal strip 333. In one example, the metal strip 333 can be at least partially coated by the coating 335 (e.g., at the interface between the first portion 322 of the metal seed region and the contacting portion 332 of the coated conductive strip 330. In some examples, the coating 337 can include substantially the same metal as the metal region 320. In some examples, the coating 335 may not be etched (e.g., the coating 335 is not etched at all).

In one example, the etching 325 can include at least partially etching, the coating 337 of the conductive strip 330, where the coated conductive strip 330 can inhibit etching, at block 108, of the first portion 322 of the metal seed region 320. In one example, the coating 337 of coated conductive strip 330 of FIG. 8 can have a thickness 331 greater than a thickness 321 of the metal region 320. In the same example, the etching 225 can include etching through the metal region 320 having a second thickness 321. In one example, as shown, the etching 225 can electrically separate the first conductive contact 236 from second conductive contact 236. In one example, as shown, the first and second conductive contacts 334, 336 can be formed on the back side 306 of the semiconductor device 300. In the same example, the etching 225 can include at least partially etching the coating 337 of the conductive strip 330 having a first thickness 331, where the coating 337 of the coated conductive strip 330 inhibits etching of the first portion 322 of the metal seed region 320 and the first thickness 331 is greater than the second thickness 321.

In an embodiment, a first etchant can be used to etch through the second portion 324 of the metal region 320 of Figure. In an example, the first etchant can include an acid having oxidizing agents (e.g., hydrogen peroxide). In some examples, the first etchant can include a base (e.g., potassium hydroxide, sodium hydroxide). In one example, the coated conductive strip 330 of FIG. 8 can include a coating having a first thickness 331 greater than a second thickness 321 of the metal region 320. In an example, the coating 337 of the coated conductive strip 330 can include substantially the same metal as the metal region 320. In one example, the first etchant can be configured to etch through the second thickness 321 of the metal seed region 220 and partially etch the coating 337 having the first thickness 331 of the conductive strip 330, as shown. In an example, the first etchant can be configured to etch through both the second portion 322 of the metal region 320 and etch through the coating 337 of the coated conductive strip 330, as shown. In one embodiment, an etch duration can be configured to allow etching through the second portion 324 of the metal region 320 and partially etching the coating 337 of the coated conductive strip 330. In some examples, the etch duration can be configured to be long enough to etch through both the second portion 324 of the metal region 320 and the coating 337 of the coated conductive strip 330. In some embodiments, multiple etchants (e.g., a first, second, etc.) can be used. In an example, the first etchant can be used to etch the metal region 320 and a second etchant can be used to etch the coating 337 of the coated conductive strip 330. In some examples, the first etchant can be configured to etch the metal region 320 including a first metal and a second etchant can be used to etch the coating 337 including a second, different, metal. In one embodiment, the coated conductive strip 330 can be referred to as a partial sacrificial etching barrier.

Figure 10:
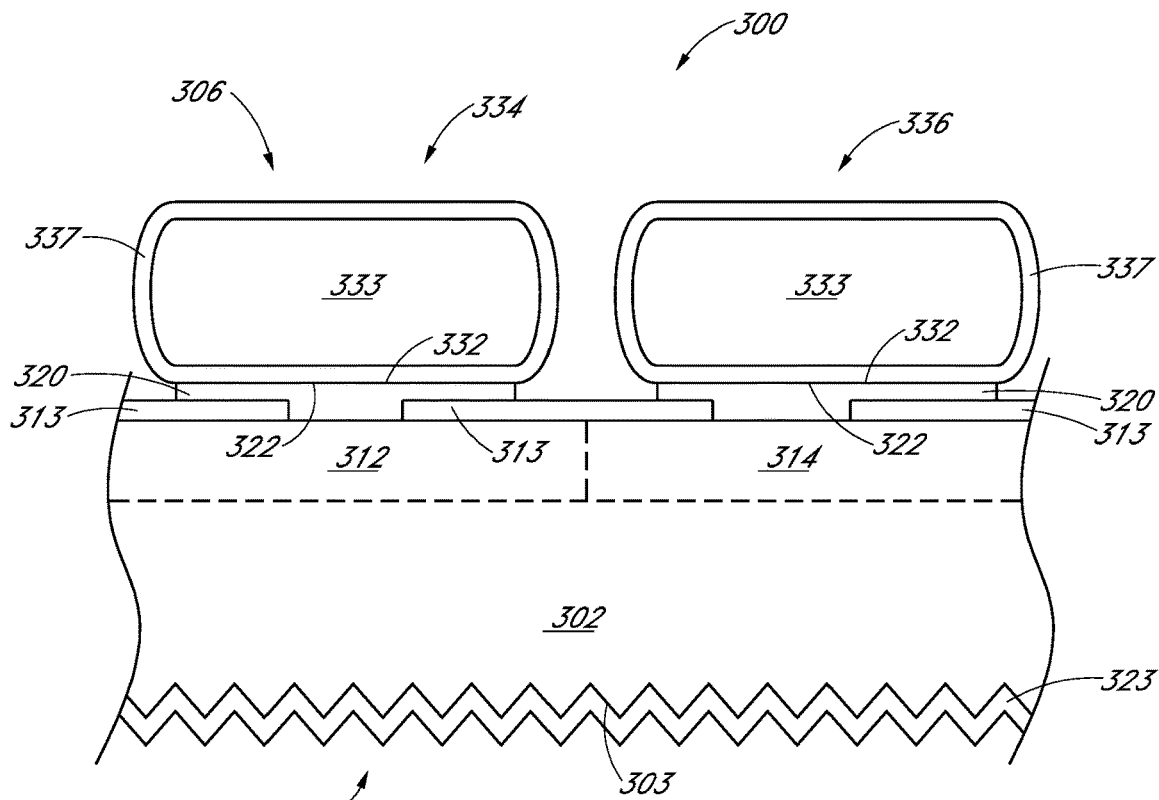
FIG. 10 illustrates another example semiconductor device, according to some embodiments.

FIG. 10 illustrates an example semiconductor device formed from the methods described in FIGS. 7-9, according to some embodiments. As shown, the semiconductor device can be a solar cell 300. As shown, the solar cell 300 can have a front side 304 which faces the sun during normal operation and a back side 306 opposite the front side 304. In one embodiment, the solar cell 300 is substantially similar to the solar cell 200 of FIG. 6. As shown, the solar cell 300 has similar reference numbers to elements of the solar cells of FIG. 6, wherein like reference numbers refer to similar elements throughout the figures. In an embodiment, the structure of the solar cell 300 is substantially similar to the structure of the solar cell 200 in FIG. 6, respectively, except as described below. Therefore the description of corresponding portions of FIG. 6 applies equally to the description of FIG. 10.

In an embodiment, the solar cell 300 can include conductive contacts 334, 336. In one embodiment, the conductive contacts 334, 336 include a coated conductive strip disposed on a metal region 320. In an example, the conductive contacts 334, 336 can be metal contact fingers. In some examples, the metal contact fingers can be interdigitated. In an embodiment, the coated conductive strip can include a metal strip 333 having a coating 337 as shown. In an example, the coating 337 can surround the metal strip 333. In an embodiment, the metal region 320 can have a thickness approximately in the range of 50-1000 nanometers. In an embodiment, the coating 337 can include aluminum (e.g., an aluminum region), aluminum/Si, nickel, copper, titanium, tungsten, and/or alloys thereof, among other examples. In an embodiment, the metal strip 333 can include nickel, copper, iron and steel, among other examples. In an embodiment, the ratio of the thickness of the coating 337 can be twice, ten times or 100 times, or more, to the thickness of the metal region 320. In one embodiment, the coating 337 can have a thickness 331 approximately in the range of 1-10 µm. In an embodiment, the coated conductive strip 330 can be a coated conductive wire, coated ribbon, coated pre-cut foil or a coated strip of foil. In one example, the coated conductive strip 330 can be a coated copper wire or a coated aluminum foil.

Figure 11:
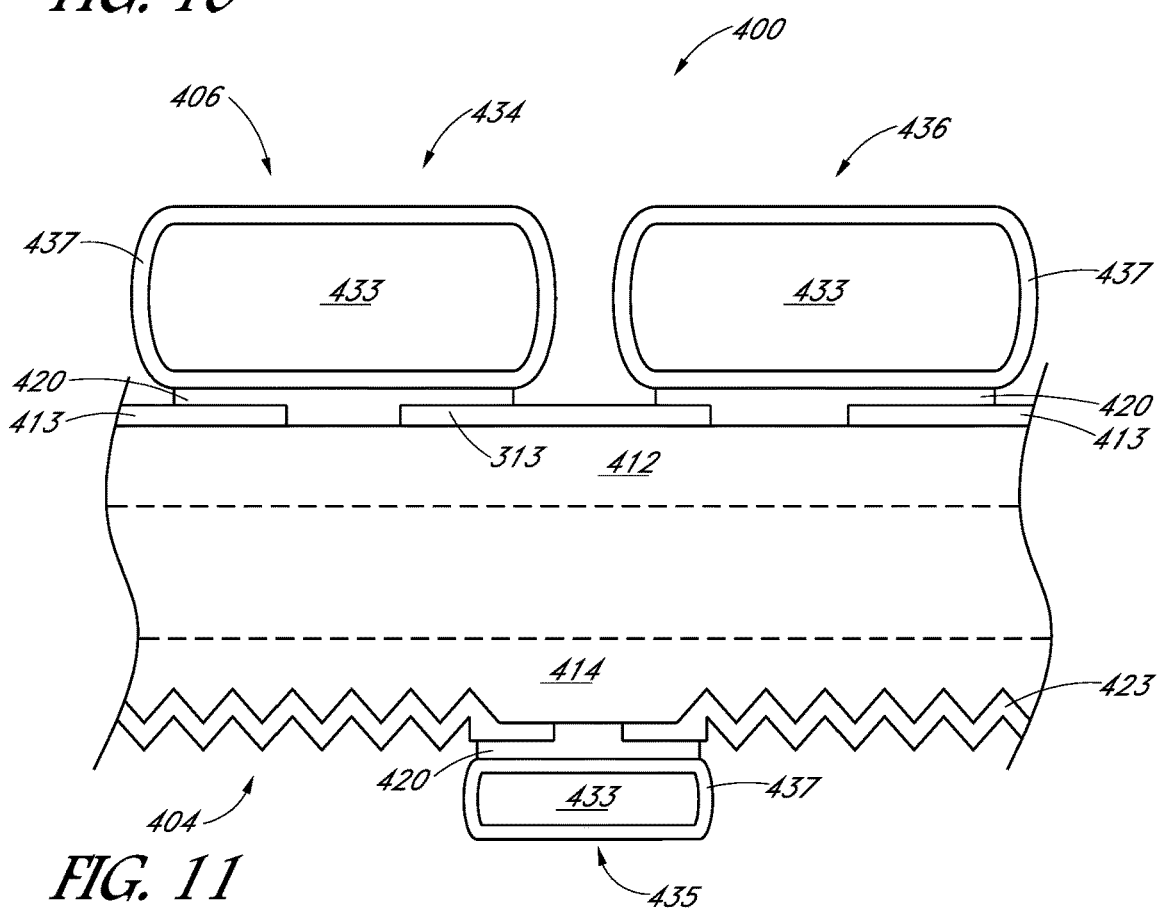
FIG. 11 illustrates still another example semiconductor device, according to some embodiments.

FIG. 11 illustrates an example semiconductor device formed from the methods described in FIGS. 7-9, according to some embodiments. As shown, the semiconductor device can be a front contact solar cell 400. As shown, the solar cell 400 can have a front side 404 which faces the sun during normal operation and a back side 406 opposite the front side 404. In one embodiment, the solar cell 400 is substantially similar to the solar cell 200 and 300 of FIGS. 6 and 10. As shown, the solar cell 400 has similar reference numbers to elements of the solar cells of FIGS. 6 and 10, wherein like reference numbers refer to similar elements throughout the figures. In an embodiment, the structure of the solar cell 400 is substantially similar to the structure of the solar cell 200 and 300 in FIGS. 6 and 7, respectively, except as described below. In an example, a front dielectric region 423, similar to the front dielectric region 323 of FIG. 10, can be formed over the surface 403. In some embodiments, the front dielectric region 423 can include silicon oxide, among other oxides. Therefore the description of corresponding portions of FIGS. 6 and 10 applies equally to the description of FIG. 11.

In an embodiment, another semiconductor region 414 can be located on the front side 404 of a solar cell 400. In an example, the semiconductor region 414 can include an N-type or P-type doped region. In an embodiment, another coated conductive contact 435 can be disposed on the semiconductor region 414 on the front side 404 of the solar cell 400. In an embodiment, the coated conductive contact 435 can also include a conductive strip 433 bonded to a metal region 420, where the conductive contact 435 is located on the semiconductor region 414 on the front side 404 of the solar cell 400. In an embodiment, the coated conductive strip 433 can have a coating 437. In some embodiments, the coated conductive strip 433 can be at least partially coated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:
1. A solar cell, comprising:
a first doped polysilicon region disposed above a substrate;
a first metal seed region disposed over the first doped polysilicon region; and
a first coated conductive wire disposed over, and thermally compressed to, the first metal seed region, wherein a portion the first coated conductive wire flatly contacts the first metal seed region and the first coated conductive wire comprises a coating completely surrounding a first conductive wire.

2. The solar cell of claim 1, wherein the first doped polysilicon region is formed over a back side of the solar cell.

3. The solar cell of claim 1, wherein the first doped polysilicon region is formed over a front side of the solar cell.

4. The solar cell of claim 1, wherein the coating comprises a thickness greater than a thickness of the first metal seed region.

5. The solar cell of claim 1, wherein the first coated conductive wire comprises an aluminum coating.

6. The solar cell of claim 1, wherein the coating of the first coated conductive wire and the first metal seed region comprise substantially the same metal.

7. The solar cell of claim 1, wherein the first conductive wire comprises a metal selected from the group consisting of copper, nickel and aluminum.

8. The solar cell of claim 1, wherein the first conductive wire comprises a thickness in a range of 50-1200 nanometers.

9. The solar cell of claim 1, wherein the first conductive wire is placed substantially parallel to the first doped polysilicon region.

10. The solar cell of claim 1, wherein the first metal seed region comprises a metal selected from the group consisting of aluminum, nickel, copper, titanium, and tungsten.

11. The solar cell of claim 1, wherein the first coated conductive wire comprises a thickness greater than 1200 nanometers.

12. A solar cell, comprising:
  a first doped polysilicon region disposed above a substrate;
  a second doped polysilicon region disposed above the substrate;
  a first metal seed region disposed over the first doped polysilicon region;
  a second metal seed region disposed over the second doped polysilicon region;
  a first coated conductive wire disposed over, and thermally compressed to, the first metal seed region, wherein a portion the first coated conductive wire flatly contacts the first metal seed region and the first coated conductive wire comprises a coating completely surrounding a first conductive wire; and
  a second coated conductive wire disposed over, and thermally compressed to, the second metal seed region, wherein a portion the second coated conductive wire flatly contacts the second metal seed region and the second coated conductive wire comprises a coating completely surrounding a second conductive wire.

13. The solar cell of claim 12, wherein the first doped polysilicon region is formed over a back side of the solar cell and the second doped polysilicon region is formed over a front side of the solar cell.

14. The solar cell of claim 12, wherein the coating of the first and second coated conductive wires comprises a thickness greater than a thickness of the first and second metal seed regions.

15. The solar cell of claim 12, wherein the coating of the first and second coated conductive wires and the first and second metal seed regions comprise substantially the same metal.

16. The solar cell of claim 12, wherein the coating of the first coated conductive wire, second coated conductive wire, first metal seed region and the second metal seed region comprise substantially the same metal.

17. The solar cell of claim 12, wherein the first and second coated conductive wire comprises an aluminum coating.

18. The solar cell of claim 12, wherein the first and second coated conductive wires comprise a metal selected from the group consisting of copper, nickel and aluminum.

19. The solar cell of claim 12, wherein the first and second coated conductive wires are placed substantially parallel to the first and second doped polysilicon regions.

20. The solar cell of claim 12, wherein the first and second metal seed regions comprise a metal selected from the group consisting of aluminum, nickel, copper, titanium, and tungsten.

* * * * *